US007733987B2

(12) United States Patent
Kishibe (10) Patent No.: US 7,733,987 B2
(45) Date of Patent: Jun. 8, 2010

(54) CLOCK SIGNAL REPRODUCTION DEVICE AND CLOCK SIGNAL REPRODUCTION METHOD (75) Inventor: Shinnichi Kishibe, Osaka (JP)

(73) Assignee: Icom Incorporated (JP)

( * ) Notice: Subject to any disclaimer, the term of this patent is extended or adjusted under 35 U.S.C. 154(b) by 734 days.

(21) Appl. No.: 11/607,650

(22) Filed: Nov. 30, 2006

(65) Prior Publication Data
US 2007/0120585 A1 May 31, 2007

(30) Foreign Application Priority Data
Nov. 30, 2005 (JP) ............... 2005-345345

(51) Int. Cl.
H03D 3/24 (2006.01)
(52) U.S. Cl. .................. 375/327; 327/156; 375/316
(58) Field of Classification Search ........... 375/327, 375/316; 327/156
See application file for complete search history.

(56) References Cited

U.S. PATENT DOCUMENTS 4,639,682 A * 1/1987 Takeuchi .............. 329/307
5,579,184 A * 11/1996 Nakanishi et al. ......... 360/51
5,950,115 A * 9/1999 Momtaz et al. ........... 455/73
6,104,222 A * 8/2000 Embree ................. 327/156
6,900,676 B1 * 5/2005 Tamura ................. 375/376
7,469,026 B2 * 12/2008 Nguyen et al. ........... 375/354
2002/0175722 A1 * 11/2002 Mano et al. ............. 327/156

FOREIGN PATENT DOCUMENTS

| JP | 58-095447 | 6/1983 |
| JP | 09-275396 | 10/1997 |
| JP | 2003-258783 | 9/2003 |

* cited by examiner

Primary Examiner—Shuwang Liu
Assistant Examiner—Michael R Neff
(74) Attorney, Agent, or Firm—Baker & McKenzie LLP (57) ABSTRACT A phase comparator detects time lag or time lead of the phase of a data signal with respect to a reproduced clock signal from a first digital VCO. A random walk filter measures a difference between number of lags and number of leads, controls the first digital VCO to shift the phase of the reproduced clock signal in a direction to cancel the difference when the absolute value of the difference reaches a predetermined value, and resets the measurement result to restart the measurement. A phase comparator detects the phase difference between reproduced clock signals from the first digital VCO and a second digital VCO and notifies it to the random walk filter. While the amount of the notified phase difference is being a predetermined amount, the random walk filter neither resets the measurement result nor shifts the phase of the reproduced clock signal from the first digital VCO.

5 Claims, 3 Drawing Sheets

CLOCK SIGNAL REPRODUCTION DEVICE AND CLOCK SIGNAL REPRODUCTION METHOD

RELATED APPLICATION

This application is based on Japanese Patent Application No. 2005-345345 filed on Nov. 30, 2005 and including specification, claims, drawings and summary. The disclosure of the above Japanese Patent Application is incorporated herein by reference in its entirety.

BACKGROUND OF THE INVENTION

1. Field of the Invention

The present invention relates a clock signal reproduction device and a clock signal reproduction method, and more particularly relates to a clock signal reproduction device and a clock signal reproduction method for reproducing a clock signal used for demodulating a modulated wave.

2. Description of the Related Art

In transmitting information using digital data, a clock signal generated by an oscillator or the like is generally used. Specifically, for transmitting information digital data is generated with such a method of representing the objective information to be transmitted, by a value of digital data at a predetermined timing specified with reference to the clock signal. Then, the generated digital data is modulated and transmitted.

Accordingly, in order to receive the digital data and reproduce (re-generate) the information, a receiver needs to acquire the same clock signal as used for generating the digital data.

Incidentally, in wireless communication, a radio wave sent out from a transmitting device reaches an antenna of a receiving device as a mixture of a direct wave and a plurality of reflected waves which are combined in the transmission path. Therefore, a plurality of modulated waves that have different phases and amplitudes are input to the receiving device. Under the influence of such a phenomenon of a radio wave traveling through many paths other than the path of the direct wave thereby incurring intense fluctuations in the phase and amplitude (i.e., a multi-path fading), the clock signal reproduced by the receiving device might cause a clock slip in the worst case.

Hence, various methods have conventionally been proposed, for enabling the device for receiving digital data to accurately reproduce the clock signal used for reproducing the received digital data.

For example, according to a method disclosed in Unexamined Japanese Patent Application KOKAI Publication No. S58-95447, a receiving device reproduces the clock signal by calculating the exclusive OR of the demodulated signal and a signal obtained by delaying the demodulated signal by a half time slot, and inputs the reproduced clock signal to a PLL (Phase Locked Loop) circuit as an originally oscillated input signal to control the phase of the clock signal.

According to a method disclosed in Unexamined Japanese Patent Application KOKAI Publication No. 2003-258783, because a slip (phase difference) that amounts to one or more clocks cannot be corrected only by controlling the phase of the clock signal with the use of a PLL circuit, a receiving device continuously monitors the clock signal reproduced from the demodulated signal and a clock signal obtained from a VCO (Voltage Controlled Oscillator) in the PLL circuit, and detects a slip that amounts to one or more clocks and that is produced between the two clock signals, and corrects the VCO with use of the detection result.

Further, according to a method disclosed in Unexamined Japanese Patent Application KOKAI Publication No. H9-275396, a receiving device solves the problem of the phase of the clock signal reproduced by itself going out of control due to an error signal produced inside a PLL circuit in a case where the clock signal as reproduced has lost any pulse that should constitute the clock signal. Specifically, according to this method, when the clock signal reproduced by the receiving device from the demodulated signal becomes asynchronous with a clock signal obtained from a VCO in the PLL circuit, the receiving device restricts an increase of the value of the error signal by narrowing the width of the high-level side or the low-level side of the pulses oscillated by the VCO depending on which of the high-level side and the low-level side of the pulses constituting the reproduced clock signal has been lost.

In order to correct the VCO by employing the method disclosed in Unexamined Japanese Patent Application KOKAI Publication No. 2003-258783, the receiving device needs to continuously monitor a slip that amounts to one clock or more and that is produced between the clock signal reproduced by the receiving device and the clock signal from the VCO. And the monitoring period generally lasts for several ten clocks. Thus, according to the method of Unexamined Japanese Patent Application KOKAI Publication No. 2003-258783, it is often impossible to accurately reproduce the clock signal, because the phase of the clock signal cannot be corrected quickly.

Further, the method disclosed in Unexamined Japanese Patent Application KOKAI Publication No. H9-275396 is a method for changing the pulse width of the reproduced clock signal, but not a method for correcting the phase of the clock signal.

SUMMARY OF THE INVENTION

The present invention was made in view of these conventional problems, and an object of the present invention is to provide a clock signal reproduction device and a clock signal reproduction method for reproducing a stable clock signal which is little likely to cause a clock slip, while quickly responding to the shifts of the phase.

To achieve the above object, a clock signal reproduction device according to a first aspect of the present invention comprises:

an output clock oscillating section which generates an output clock signal and shifts a phase of the output clock signal in a direction indicated by an output clock control signal supplied thereto;

an internal clock oscillating section which generates an internal clock signal;

a first data temporal lead/lag detecting section which acquires a data signal and the output clock signal, detects a time lead or a time lag of a phase of the data signal with respect to the output clock signal, and generates a first temporal lead/lag detection signal representing a result of detection;

an output clock control section which acquires the first temporal lead/lag detection signal, measures a cumulated amount of the time lead or the time lag based on the first temporal lead/lag detection signal, and when the cumulated amount reaches a first predetermined value, generates the output clock control signal, which instructs that the phase of the output clock signal should be shifted in a direction to cancel occurrence of the time lag or the time lead which has reached the cumulated amount, supplies the generated output clock control signal to the output clock oscillating section, and newly starts measuring; and an inter-clock phase difference detecting section which acquires the output clock signal and the internal clock signal, detects a phase difference between the output clock signal and the internal clock signal, and generates an inter-clock phase difference signal representing the detected phase difference, wherein the output clock control section further acquires the inter-clock phase difference signal, and stops generating the output clock control signal while an amount of the phase difference represented by the inter-clock phase difference signal is being a predetermined amount.

According to this clock signal reproduction device, the output clock signal can quickly respond to the shifts of the phase, and the phase difference between the output clock signal and the internal clock signal is kept within a predetermined amount. Therefore, as long as the internal clock signal is highly stable, it is possible to prevent occurrence of a clock slip and the stability of the output clock signal is secured.

The internal clock oscillating section may comprise a section which shifts a phase of the internal clock signal in a direction indicated by an internal clock control signal supplied to the section.

In this case, the clock signal reproduction device may further comprise:

a second data temporal lead/lag detecting section which acquires the data signal and the internal clock signal, detects a time lag or a time lead of the phase of the data signal with respect to the internal clock signal, and generates a second temporal lead/lag detection signal representing a result of detection; and an internal clock control section which acquires the second temporal lead/lag detection signal, measures a cumulated amount of the time lag or the time lead based on the second temporal lead/lag detection signal, and when the cumulated amount reaches a second predetermined value larger than the first predetermined value, generates the internal clock control signal, which instructs that the phase of the internal clock signal should be shifted in a direction to cancel occurrence of the time lag or the time lead which has reached the cumulated amount, supplies the generated internal clock control signal to the internal clock oscillating section, and newly starts measuring.

With this structure, the stability of the output clock signal is secured because a highly stable internal clock signal can be obtained.

The output clock control section may perform the measurement of the cumulated amount of the time lag or the time lead, etc., by comprising, for example, a section which acquires the first temporal lead/lag detection signal, measures a difference between a number of times the time lag is detected and a number of times the time lead is detected based on the first temporal lead/lag detection signal, stores data representing a result of measurement obtained after measurement is started, and when an absolute value of the difference reaches the first predetermined value, generates the output clock control signal, which instructs that the phase of the output clock signal should be shifted in a direction to cancel occurrence of the difference, supplies the generated output clock control signal to the output clock oscillating section, initializes a value of the data representing the result of measurement, and newly starts measuring.

The first data temporal lead/lag detecting section may detect a timing at which a value of the data signal changes, and detect the time lag or the time lead of the phase of the data signal by determining when this timing occurs, before or after a timing at which a value of the output clock signal changes.

A clock signal reproduction method according to a second aspect of the present invention comprises:

an output clock oscillating step of generating an output clock signal, and changing a phase of the output clock signal in a direction indicated by an output clock control signal;

an internal clock oscillating step of generating an internal clock signal;

a first data temporal lead/lag detecting step of acquiring a data signal and the output clock signal, detecting a time lag or a time lead with respect to the output clock signal, of a timing at which a value of the data signal changes, and generating a first temporal lead/lag detection signal representing a result of detection;

an output clock controlling step of acquiring the first temporal lead/lag detection signal, measuring a cumulated amount of the time lag or the time lead based on the first temporal lead/lag detection signal, and when the cumulated amount reaches a first predetermined value, generating the output clock control signal, which instructs that the phase of the output clock signal should be shifted in a direction to cancel occurrence of the time lag or the time lead which has reached the cumulated amount, supplying the generated output clock control signal to the output clock oscillating step, and newly starting measuring; and an inter-clock phase difference detecting step of acquiring the output clock signal and the internal clock signal, detecting a phase difference between the output clock signal and the internal clock signal, and generating an inter-clock phase difference signal representing the detected phase difference, wherein at the output clock controlling step, the inter-clock phase difference signal is further acquired, and generation of the output clock control signal is stopped while an amount of the phase difference represented by the inter-clock phase difference signal is being a predetermined amount.

According to this clock signal reproduction method, the output clock signal can quickly respond to the shifts of the phase, and the phase difference between the output clock signal and the internal clock signal is kept within a predetermined amount. Therefore, as long as the internal clock signal is highly stable, it is possible to prevent occurrence of a clock slip and the stability of the output clock signal is secured.

A program according to a third aspect of the present invention controls a computer to function as:

an output clock oscillating section which generates an output clock signal and shifts a phase of the output clock signal in a direction indicated by an output clock control signal supplied thereto;

an internal clock oscillating section which generates an internal clock signal;

a first data temporal lead/lag detecting section which acquires a data signal and the output clock signal, detects a time lag or a time lead with respect to the output clock signal, of a timing at which a value of the data signal changes, and generates a first temporal lead/lag detection signal representing a result of detection;

an output clock control section which acquires the first temporal lead/lag detection signal, measures a cumulated amount of the time lead or the time lag based on the first temporal lead/lag detection signal, and when the cumulated amount reaches a first predetermined value, generates the output clock control signal, which instructs that the phase of the output clock signal should be shifted in a direction to cancel occurrence of the time lag or the time lead which has reached the cumulated amount, supplies the generated output clock control signal to the output clock oscillating section, and newly starts measuring; and an inter-clock phase difference detecting section which acquires the output clock signal and the internal clock signal, detects a phase difference between the output clock signal and the internal clock signal, and generates an inter-clock phase difference signal representing the detected phase difference, wherein the output clock control section further acquires the inter-clock phase difference signal, and stops generating the output clock control signal while an amount of the phase difference represented by the inter-clock phase difference signal is being a predetermined amount.

According to a computer executing this program, the output clock signal can quickly respond to the shifts of the phase, and the phase difference between the output clock signal and the internal clock signal is kept within a predetermined amount. Therefore, as long as the internal clock signal is highly stable, it is possible to prevent occurrence of a clock slip and the stability of the output clock signal is secured.

According to the present invention, a clock signal reproduction device, a clock signal reproduction method, and a program for reproducing a stable clock signal which is little likely to cause a clock slip, while quickly responding to the shifts of the phase.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

Figure 1:
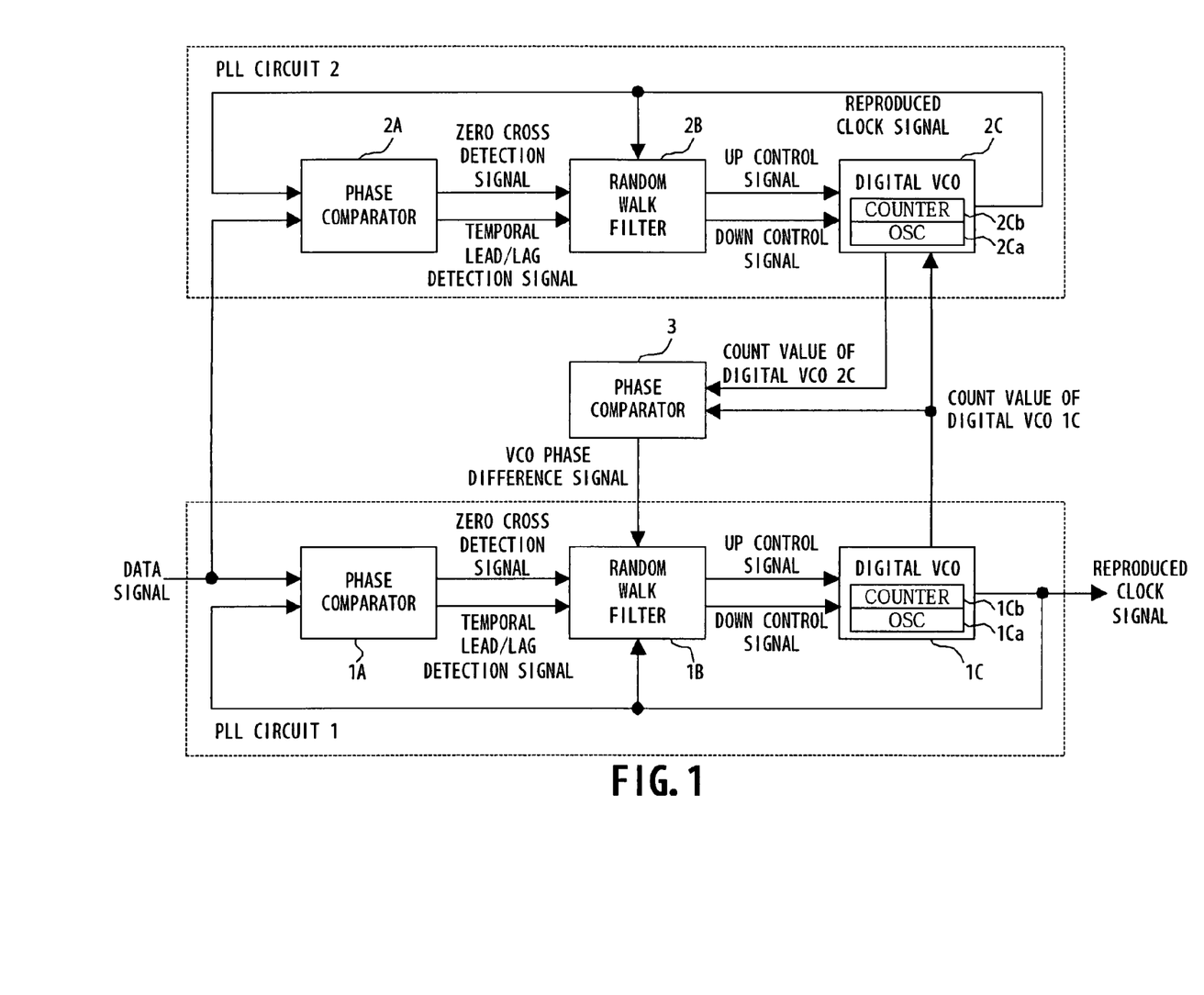
FIG. 1 is a diagram showing the structure of a clock reproducing device according to an embodiment of the present invention.

An embodiment of the present invention will be explained with reference to the drawings, by employing a clock reproducing device as an example. FIG. 1 is a diagram showing the structure of a clock reproducing device according to an embodiment of the present invention. As shown in FIG. 1, the clock reproducing device comprises a PLL (Phase Locked Loop) circuit 1, a PLL circuit 2, and a phase comparator 3.

Figure 2A:
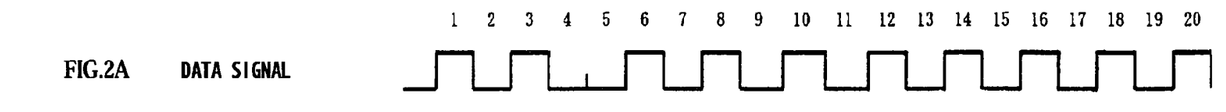
FIG. 2A to FIG. 2H are graphs showing examples of temporal changes of the waveform or value of signals generated by each component of the clock reproducing device of FIG. 1.
Figure 2B:
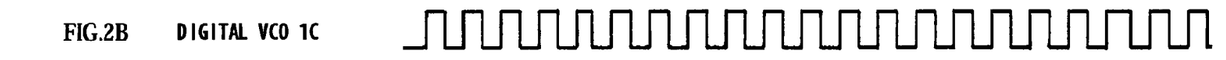
Figure 2C:
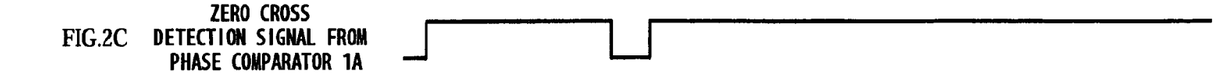
Figure 2D:
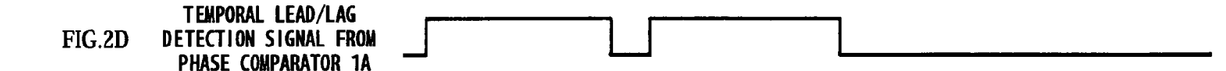
Figure 2E:
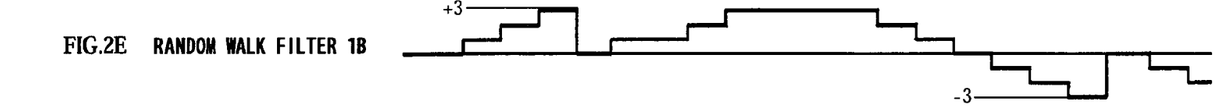
Figure 2F:
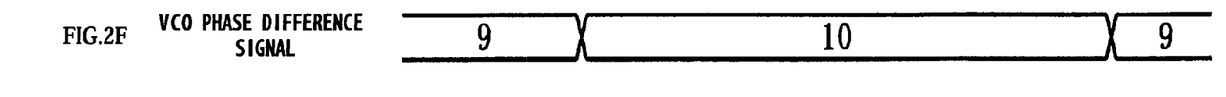
Figure 2G:
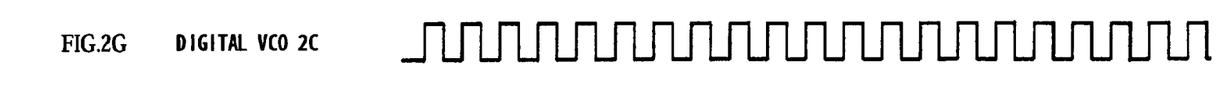
Figure 2H:
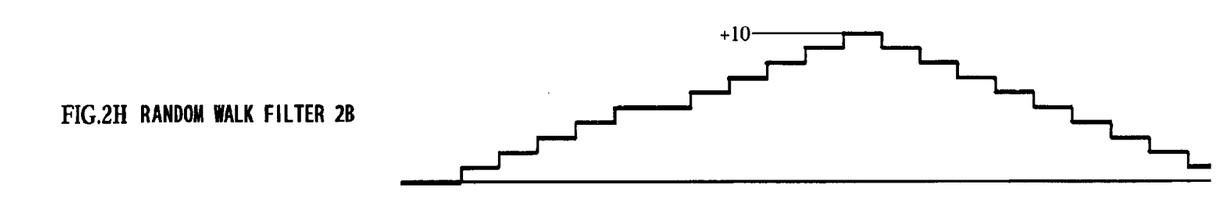

FIGS. 2A to 2H are graphs showing examples of temporal changes of the waveform or value of the signals generated by each of the later-described components of the clock reproducing device. Specifically, it is shown that a data signal input from the outside has a waveform as shown in FIG. 2A, and reproduced clock signals output from a digital VCO 1C and a digital VCO 2C have waveforms as shown in FIG. 2B and FIG. 2G respectively. Further, it is shown that a zero cross detection signal output from a phase comparator 1A has a waveform as shown in FIG. 2C, and a temporal lead/lag detection signal output from the phase comparator 1A has a waveform as shown in FIG. 2D. It is further shown that signals that are generated when later-described random walk filter 1B and random walk filter 2B have their own counters count up or down based on the zero cross detection signal or the temporal lead/lag detection signal have waveforms as shown in FIG. 2E and FIG. 2H respectively. Furthermore, it is shown that a phase difference signal representing the phase difference between the reproduced clock signals output from the digital VCO 1C and the digital VCO 2C has a waveform as shown in FIG. 2F.

The PLL circuit 1 is one of frequency multipliers for amplifying a frequency, and comprises the phase comparator 1A, the random walk filter 1B, and the digital VCO (Voltage Controlled Oscillator) 1C.

The PLL circuit 2 comprises a phase comparator 2A, the random walk filter 2B and the digital VCO 2C.

The phase comparator 1A is a device for comparing the phase of a data signal received from the outside and the phase of a clock signal reproduced by the digital VCO 1C. For example, the phase comparator 1A receives a binary data signal from the outside, that has been obtained by an external demodulating device by demodulating an FSK (Frequency Shift Keying) modulated signal, while receiving a reproduced clock signal continuously generated by the digital VCO 1C. Then, the phase comparator 1A determines whether or not the values of these acquired data signals have crossed the zero-voltage level, and generates a zero cross detection signal at the timing at which the data signals are determined to cross the zero-voltage level. The phase comparator 1A supplies the generated zero cross detection signal to the random walk filter 1B.

Further, the phase comparator 1A determines whether the phase of the clock signals has leaded time or lag time as compared with the original phase at the timing at which the clock signal received from the outside and the clock signal reproduced by the digital VCO 1C cross the zero-voltage level. Then, the phase comparator 1A generates a temporal lead/lag detection signal representing the result of the determination, and supplies the generated temporal lead/lag detection signal to the random walk filter 1B.

Figure 3:
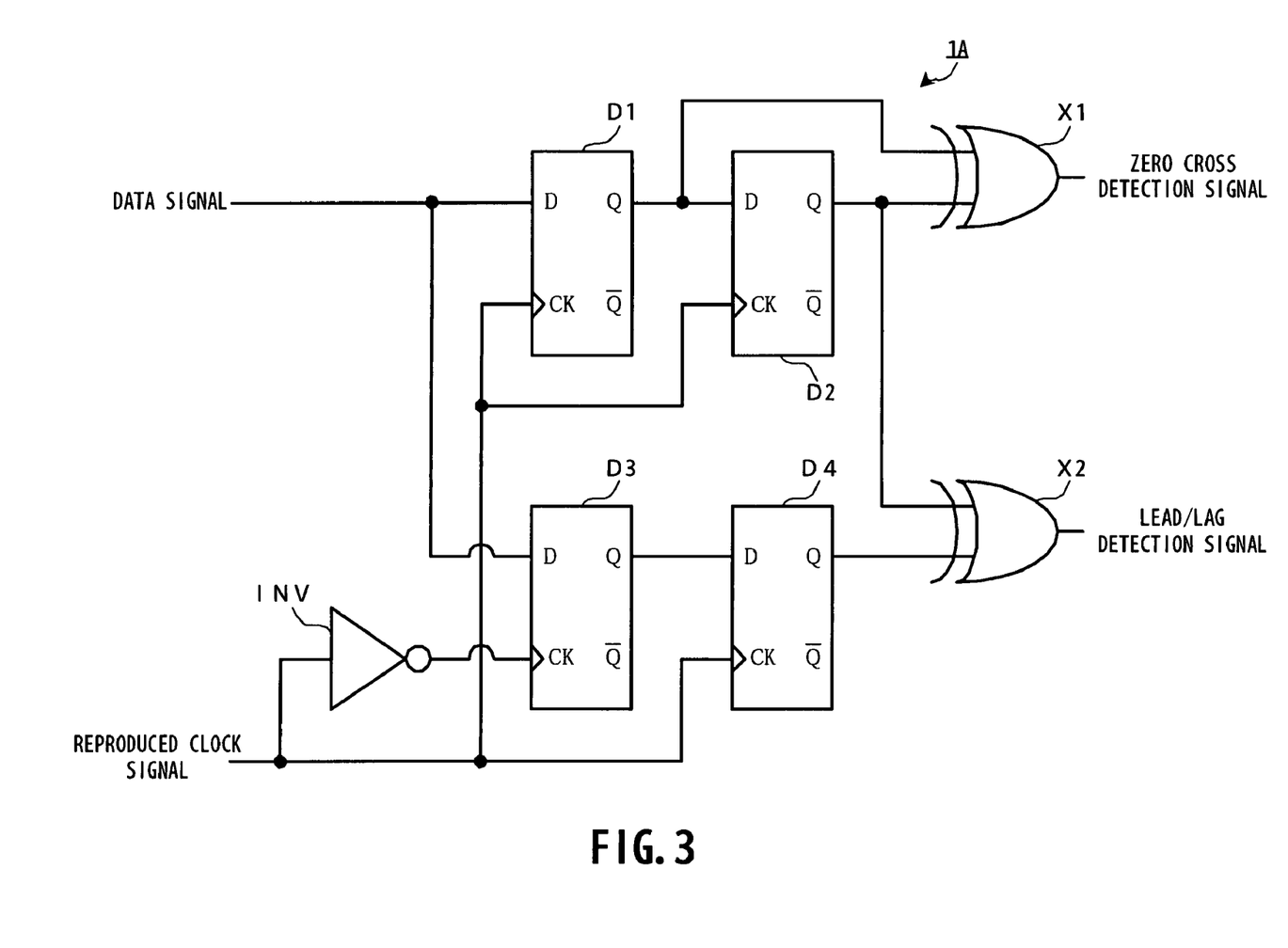
FIG. 3 is a diagram showing the structure of a phase comparator.

More specifically, the phase comparator 1A comprises, for example, a data signal input terminal, a reproduced clock signal input terminal, a zero cross detection signal output terminal, a temporal lead/lag detection signal output terminal, D latches D1 to D4, an inverter INV, and XOR (exclusive OR) gates X1 and X2, as shown in FIG. 3. The data signal input terminal is a terminal for receiving a clock signal from the outside, and the reproduced clock signal input terminal is a terminal for receiving a clock signal reproduced by the digital VCO 1C.

The D latches D1 to D4 are circuits for holding the signals from the data signal input terminal and reproduced clock signal input terminal, and each D latch comprises a clock input terminal CK, a data input terminal D, and a data output terminal Q.

Each D latch stores the logical value of a signal supplied to its data input terminal D at a time a signal supplied to its clock input terminal CK rises from a low level to a high level. Then, each D latch keeps outputting a signal representing the stored logical value from its data output terminal Q until the signal supplied to its clock input terminal CK again rises to the high level.

The inverter INV comprises an input terminal and an output terminal, generates a signal whose logical value has been inverted from that of a signal supplied to its input terminal, and outputs the generated signal to the D latch 3 from its output terminal.

The XOR gates X1 and X2 each comprise two input terminals and one output terminal. Each XOR gate generates a signal representing the exclusive OR of the logical values of signals supplied to its two input terminals, and outputs the generated signal to the random walk filter 1B from its output terminal.

The data input terminals D of the D latches D1 and D3 are connected to each other and constitute the data signal input terminal of the phase comparator 1A. The data input terminal D of the D latch D2 is connected to the data output terminal Q of the D latch D1, and the data input terminal D of the D latch D4 is connected to the data output terminal Q of the D latch D3.

The clock input terminals CK of the D latches D1, D2, and D4 are connected to one another and constitute the reproduced clock signal input terminal of the phase comparator 1A. The clock input terminal CK of the D latch D3 is connected to the output terminal of the inverter INV, and the input terminal of the inverter INV is connected to the reproduced clock signal input terminal of the phase comparator 1A.

One input terminal of the XOR gate X1 is connected to the data output terminal Q of the D latch D1 while the other input terminal thereof is connected to the data output terminal Q of the D latch D2, and the output terminal thereof constitutes the zero cross detection signal output terminal. One input terminal of the XOR gate X2 is connected to the data output terminal Q of the D latch D2 while the other input terminal thereof is connected to the data output terminal Q of the D latch D4, and the output terminal thereof constitutes the temporal lead/lag detection signal output terminal.

In the phase comparator 1A shown in FIG. 3, when a reproduced clock signal is supplied to the reproduced clock signal input terminal and a data signal is input to the data signal input terminal, each time the reproduced clock signal rises, the D latch D1 stores the logical value of the clock signal input thereto at the time of the rise.

And each time the reproduced clock signal falls, the D latch D3 stores the logical value of the data signal supplied to the data signal input terminal at the time of the fall.

And each time the reproduced clock signal rises, the D latch D2 stores the logical value of the signal output from the D latch D1 at the time of the rise. This logical value is the logical value of the data signal supplied to the data signal input terminal when the reproduced clock signal rose last.

And each time the reproduced clock signal rises, the D latch D4 stores the logical value of the signal output from the D latch D3 at the time of the rise. This logical value is the logical value of the data signal supplied to the data signal input terminal when the reproduced clock signal fell last.

Then, the XOR gate X1 outputs a signal (zero cross detection signal) representing the exclusive OR of the two values stored in the D latches D1 and D2. The XOR gate X2 outputs a signal (temporal lead/lag detection signal) representing the exclusive OR of the two values stored in the D latches D2 and D4.

Specifically, for example, assume that the logical value of a data signal supplied to the data signal input terminal at a time a reproduced clock signal first rises is first data, the logical value of the data signal at the time the reproduced clock signal first falls is second data, and thereafter the logical value of the data signal at the time the reproduced clock signal rises an n-th time (where n is a natural number) is $\{(2 \cdot n)-1\}$th data, and the logical value of the data signal at the time the reproduced clock signal falls an n-th time is $(2 \cdot n)$th data. In a case where the relationship between the reproduced clock signal and the logical values is defined in this way, at the time the D latch D2 stores k-th data (where k is a positive odd number), the D latch D1 stores (k+2)th data and the D latch D4 stores (k+1)th data.

Then, the XOR gate X1 outputs a signal (zero cross detection signal) representing the exclusive OR of the logical values of two data, namely the k-th data and the (k+2)th data. The XOR gate X2 outputs a signal (temporal lead/lag detection signal) representing the exclusive OR of the logical values of two data, namely the k-th data and the (k+1)th data.

In a case where the logical value of the zero cross detection signal is "1", it means that the logical values of the k-th data and the (k+2)th data are different from each other. Accordingly, in this case, it can be said that the data signal supplied to the phase comparator 1A crosses the zero-voltage level (has its logical value change) at around the time the (k+1)th data is sampled. In a case where the logical value of the zero cross detection signal is "0", the logical values of the k-th data and the (k+2)th data are the same. Accordingly, in this case, it can be said that the data signal does not cross the zero-voltage level between the two timings at which the two data are sampled.

In a case where the logical value of a temporal lead/lag detection signal is "1", it means that the logical values of the k-th data and the (k+1)th data are different from each other. In a case where the logical value of a temporal lead/lag detection signal is "0", it means that the logical values of the k-th data and the (k+1)th data are the same.

Accordingly, in a case where the logical value of the zero cross detection signal is "1" (i.e., the data signal crosses the zero-voltage level at around the time the (k+1)th data is sampled) and also the logical value of the temporal lead/lag detection signal is "1", it can be said that this zero cross occurs between when the k-th data is sampled and when the (k+1)th data is sampled, to be more accurate. That is, it can be said that the phase of the reproduced clock signal has leaded time.

On the other hand, in a case where the logical value of the zero cross detection signal is "1" while the logical value of the temporal lead/lag detection signal is "0", it can be said that the zero cross occurs between when the (k+1)th data is sampled and when the (k+2)th data is sampled. That is, it can be said that the phase of the reproduced clock has lag time.

The random walk filter 1B comprises a counter circuit which can count up, count down, and reset a count value.

When activated, the random walk filter 1B stores the initial value (for example, 0) of a count value. Then, the random walk filter 1B receives a zero cross detection signal and a temporal lead/lag detection signal from the phase comparator 1A. Further, the random walk filter 1B receives a reproduced clock signal from the VCO 1C. The random walk filter 1B also receives a VCO phase difference signal to be described later, from the phase comparator 3.

In a case where the logical value of the temporal lead/lag detection signal is "1" while the logical value of the received zero cross detection signal is being "1", the random walk filter 1B increments (counts up) the count value stored therein by 1 each time the reproduced clock signal supplied thereto rises, until the count value reaches a predetermined upper limit value (the upper limit value of the count value). In a case where the logical value of the temporal lead/lag detection signal is "0" while the logical value of the received zero cross detection signal is being "1", the random walk filter 1B decrements (counts down) the count value by 1 each time the reproduced clock signal supplied thereto rises, until the count value reaches a predetermined lower limit value (the lower limit value of the count value). The upper limit value and lower limit value of the count value are in a relationship that the upper limit value is a positive value and the lower limit value is a negative value, and the absolute values of both the values are equal. In a case where the logical value of the received zero cross detection signal is "0", the random walk filter 1B retains the count value without changing it.

When the count value reaches its upper limit value, the random walk filter 1B resets the count value (i.e., returns the value to its initial value) instead of counting up the value. Then, the random walk filter 1B supplies a down control signal to the digital VCO 1C for instructing that the digital VCO 1C should delay the phase of the reproduced clock signal. In other words, the down control signal instructs the digital VCO 1C to decrease the frequency of the oscillation. On the other hand, when the count value reaches its lower limit value, the random walk filter 1B resets the count value instead of counting down the value, and supplies an up control signal to the digital VCO 1C for instructing that the digital VCO 1C should advance the phase of the reproduced clock signal. In other words, the up control signal instructs the digital VCO 1C to increase the frequency of the oscillation. Note that FIG. 2E shows a case where the upper limit value of the count value of the random walk filter 1B is (+3), and the lower limit value thereof is (−3).

By performing the above-described operations, the random walk filter 1B measures the cumulated (accumulated) amount of time lag or time lead of the phase of the data signal (or the difference between the number of times a time lag of the phase is detected and the number of times a time lead of the phase is detected), based on the temporal lead/lag detection signal. Then, when the absolute value of the count value indicating the cumulated amount reaches the predetermined value, the random walk filter 1B generates the up control signal or the down control signal to control the digital VCO 1C such that the phase of the reproduced clock signal is shifted in a direction to cancel the occurrence of the time lag or time lead that has reached this cumulated amount. Then, after performing this operation, the random walk filter 1B initializes the result of the measurement, and starts a new measurement for the cumulated amount of time lag or time lead of the phase of the data signal.

However, in a case where the value of the VCO phase difference signal supplied from the phase comparator 3 reaches a predetermined upper limit value (the upper limit value of the phase difference), the random walk filter 1B does not reset the count value but holds the count value as is, even in a case where the count value has reached its upper limit value. Further, in a case where the value of the VCO phase difference signal reaches a predetermined lower limit value (the lower limit value of the phase difference), the random walk filter 1B does not reset the count value but holds the value as is, even in a case where the count value has reached its lower limit value. Note that FIG. 2F shows a case where the upper limit value of the phase difference is 10.

The digital VCO 1C comprises an oscillator 1Ca and a counter circuit 1Cb.

The oscillator 1Ca of the digital VCO 1C generates an oscillation signal comprising pulses having a constant frequency which is sufficiently higher than that of the reproduced clock signal to be generated by the digital VCO 1C.

The counter circuit 1Cb of the digital VCO 1C counts cycles of the oscillation signal and controls the signal level of the reproduced clock signal. More specifically, the counter circuit 1Cb of the digital VCO 1C continuously counts the number of pulses of the oscillation signal, by incrementing the count value of the oscillation signal each time it detects a pulse constituting this oscillation signal. The counter circuit 1Cb continuously notifies the count value currently stored therein to the phase comparator 3. Further, the counter circuit 1Cb generates the reproduced clock signal by performing a later-described operation, and supplies the generated reproduced clock signal to the phase comparator 1A and the random walk filter 1B.

In the initial state, the counter circuit 1Cb of the digital VCO 1C stores an arbitrary initial value (for example, 0) as the count value of the oscillation signal. Then, the counter circuit 1Cb changes the logical value of the reproduced clock signal (i.e., changes the value to a low level when the value is currently at a high level, and changes the value to the high level when the value is currently at the low level) each time the count value of the oscillation signal reaches a predetermined value, and returns the count value of the oscillation signal to the initial value (for example, returns the count value of the oscillation signal to 0). By repeating this operation of changing the logical value and resetting the count value, the counter circuit 1Cb generates the reproduced clock signal, which has a predetermined frequency. When the digital VCO 1C starts generating the reproduced clock signal, it notifies the count value stored therein to the digital VCO 2C of the PLL circuit 2.

When the up control signal is supplied to the digital VCO 1C from the random walk filter 1B, the counter circuit 1Cb of the digital VCO 1C further adds 1 to the count value of the oscillation signal in response to this up control signal. Then, in a case where the count value of the oscillation signal reaches the above-described predetermined value as the result of the addition, the counter circuit 1Cb changes the logical value of the reproduced clock signal and returns the count value to the initial value. As a result, the phase of the reproduced clock signal is advanced more forward than before.

On the other hand, when the down control signal is supplied to the digital VCO 1C from the random walk filter 1B, the counter circuit 1Cb of the digital VCO 1C stops counting up the current count value for a time amounting to one pulse of the oscillation signal, in response to this down control signal. As a result, the phase of the reproduced clock signal is delayed (retarded) more backward than before.

Next, the PLL circuit 2 will be explained.

The PLL circuit 2 has substantially the same structure as the PLL circuit 1. Specifically, the PLL circuit 2 comprises the phase comparator 2A, the random walk filter 2B, and the digital VCO 2C. The phase comparator 2A, the random walk filter 2B, and the digital VCO 2C have substantially the same structure as the phase comparator 1A, the random walk filter 1B, and the digital VCO 1C, respectively. The connection relation among the phase comparator 2A, the random walk filter 2B, and the digital VCO 2C is substantially the same as the connection relation among the phase comparator 1A, the random walk filter 1B, and the digital VCO 1C.

However, the PLL circuit 2 is different from the PLL circuit 1 in the following three points (1) to (3).

(1) The absolute value of the upper limit value and lower limit value of the count value of the random walk filter 2B is larger than the corresponding values of the random walk filter 1B (FIG. 2H shows a case where the upper limit value of the count value of the random walk filter 2B is 10 or larger). Therefore, when time lag or time lead of the data signal is continuously detected, the random walk filter 2B resets the count value less frequently than the random walk filter 1B. Accordingly, the digital VCO 2C receives the up control signal and the down control signal less frequently than the digital VCO 1C receives them. That is, digital VCO 2C is more highly stable.

(2) The random walk filter 2B receives no VCO phase difference signal from the phase comparator 3. Accordingly, the random walk filter 2B necessarily resets the count value stored therein, when the count value reaches its upper limit value or its lower limit value.

(3) The digital VCO 2C starts generating a reproduced clock signal after the count value of the oscillation signal is notified thereto from the digital VCO 1C. Specifically, when the count value of the oscillation signal is notified from the digital VCO 1C, the digital VCO 2C stores this count value as the initial value and starts counting the number of pulses of the oscillation signal generated by the digital VCO 2C itself. The digital VCO 2C needs not to notify the count value stored therein to the digital VCO 1C.

The phase comparator 3 comprises, for example, a subtraction circuit or the like. The phase comparator 3 receives the notification of the count values of the oscillation signals counted by the counter circuit 1Cb and 2Cb in the digital VCO 1C and the digital VCO 2C, respectively, generates data representing the difference between the count values notified thereto concurrently (the difference being the value obtained by subtracting the count value of the counter circuit 2Cb in the digital VCO 2C from the count value of the counter circuit 1Cb in the digital VCO 1C, or the value obtained by subtracting the count value of the counter circuit 1Cb in the digital VCO 1C from the count value of the counter circuit 2Cb in the digital VCO 2C), and supplies this data to the random walk filter 1B as the VCO phase difference signal.

By performing the above-described operation, the digital VCO 1C generates the reproduced clock signal and the digital VCO 2C generates the reproduced clock signal, which is to be used inside the PLL circuit 2.

When the phase of the data signal continuously leads time or loses time with respect to the reproduced clock signal generated by the digital VCO 1C, the reproduced clock signal generated by the digital VCO 1C responsively shifts its phase to be advanced more forward (or to be delayed more backward) than before. Since the reproduced clock signal shifts its phase even in a case where time lead (or time lag) of the phase of the data signal has occurred relatively a small number of times (four times in the example shown in FIG. 2B), it quickly responds to the changes of the data signal.

On the other hand, the phase of the reproduced clock signal generated by the digital VCO 2C shifts only limitedly when time lead (or time lag) of the data signal has occurred relatively a large number of times (ten times or more in the example shown in FIG. 2G). Therefore, the reproduced clock signal generated by the digital VCO 2C is highly stable.

The reproduced clock signal generated by the digital VCO 1C is controlled such that the phase difference between the reproduced clock signal generated by the digital VCO 1C and the reproduced clock signal generated by the digital VCO 2C does not exceed a predetermined amount (in the example shown in FIG. 2H, this amount is ten counts, if it is represented by the count value of the oscillation signal). Accordingly, it is possible to prevent the reproduced clock signal generated by the digital VCO 1C from causing a clock slip, and to secure stability.

Further, since the present clock reproducing device as a whole can be constituted by a digital circuit, it can easily be incorporated into an FPGA (Field Programmable Gate Array). Further, the present clock reproducing device can be easily built up by a small number of logical circuits such as an addition/subtraction circuit, a comparison circuit, a counter, etc.

The structure of the clock reproducing device is not limited to the above-described.

For example, part or all of the phase comparator 1A, the phase comparator 2A, the random walk filter 1B, the random walk filter 2B, the digital VCO 1C, the digital VCO 2C, and the phase comparator 3 may be constituted by a processor such as a DSP (Digital Signal Processor), a CPU (Central Processing Section), etc., or by a memory storing a program to be executed by the processor. In this case, a single processor may perform part or all of the functions of the phase comparator 1A, the phase comparator 2A, the random walk filter 1B, the random walk filter 2B, the digital VCO 1C, the digital VCO 2C, and the reproduced phase comparator 3.

The initial value of the count value of the digital VCO 2C may not be the value notified thereto from the digital VCO 1C. For example, in a case where the data signal includes a preamble section which represents a sequence of values arranged in a known pattern, the correlation between the pattern of values of the data signal inputted into the phase comparator 2A and this known pattern may be obtained by a well-known method, and the initial value of the count value of the digital VCO 2C may be selected such that the patterns are the most highly correlated.

The digital VCO 1C and the digital VCO 2C may be designed to be able to reload the initial value of their own count value from an arbitrary external device. The random walk filter 1B and the random walk filter 2B may also be designed to be able to reload part or all of the initial value, upper limit value, and lower limit value of their own count value, and the upper limit value and lower limit value of the phase difference from an arbitrary external device.

If the digital VCO 1C and digital VCO 2C and the random walk filter 1B and random walk filter 2B are designed to be able to reload these values, it is possible to variously shift the degree of stability of the phase of the reproduced clock signal and the quickness of response (responsiveness) to the changes of the data signal, depending on the needs of the user of the clock signal reproduction device.

If the random walk filter 2B is designed to be able to reload the upper limit value and lower limit value of its count value, it is possible to make the PLL circuit 2 perform such an operation of increasing the responsiveness of the reproduced clock signal generated by the digital VCO 2C by loading values whose absolute value is relatively small as the upper limit value and lower limit value of the count value in the initial state, while increasing the stability of the reproduced clock signal by reloading values whose absolute value is relatively large as a new upper limit value and a new lower limit value of the count value when the phase of the reproduced clock signal becomes sufficiently stable. In this case, the initial value of the count value of the digital VCO 2C may not necessarily be the value notified from the digital VCO 1C.

An embodiment of the present invention has been explained. The clock signal reproduction device according to the present invention can be realized by a general-purpose computer system not by a particular computer system.

For example, it is possible to constitute the above-described clock reproducing device by installing a program for controlling a computer (processor, DSP (Digital Signal Processor) and so on), to perform the operations of the phase comparator 1A, the phase comparator 2A, the random walk filter 1B, the random walk filter 2B, the digital VCO 1C, the digital VCO 2C, and the reproduced phase comparator 3 described above on the computer from a recording medium (a CD-ROM, an MO, a flexible disk, etc.) storing this program.

Further, this program may be uploaded on a bulletin board system (BBS) on a communication line so that the uploaded program may be distributed through the communication line, or a carrier wave may be modulated by a signal representing this program and the obtained modulated wave may be transmitted so that an apparatus receiving this modulated wave may demodulate the modulated wave and restore the program.

When this program is activated and executed under the control of an OS in the same way as other application programs are executed, the above-described process can be performed.

In a case where the OS assumes part of the process of this program or the OS constitutes part of one component of the present invention, a program from which such part is excluded may be stored on a recording medium. Also in this case, according to the present invention, a program for executing each function or step to be performed by the computer is stored on the recording medium.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

What is claimed is:

1. A clock signal reproduction device, comprising:
    an output clock oscillating section which generates an output clock signal and shifts a phase of the output clock signal in a direction indicated by an output clock control signal supplied thereto;
    an internal clock oscillating section which generates an internal clock signal;
    a first data temporal lead/lag detecting section which acquires a data signal and the output clock signal, detects a time lag or a time lead of a phase of the data signal with respect to the output clock signal, and generates a first temporal lead/lag detection signal representing a result of detection;
    an output clock control section which acquires the first temporal lead/lag detection signal, measures a cumulated amount of the time lead or the time lag based on the first temporal lead/lag detection signal, and when the cumulated amount reaches a first predetermined value, generates the output clock control signal, which instructs that the phase of the output clock signal should be shifted in a direction to cancel occurrence of the time lag or the time lead which has reached the cumulated amount, supplies the generated output clock control signal to said output clock oscillating section, and newly starts measuring;
    an inter-clock phase difference detecting section which acquires the output clock signal and the internal clock signal, detects a phase difference between the output clock signal and the internal clock signal, and generates an inter-clock phase difference signal representing the detected phase difference,
    wherein said output clock control section further acquires the inter-clock phase difference signal, and stops generating the output clock control signal while an amount of the phase difference represented by the inter-clock phase difference signal is being a predetermined amount, and
    wherein said internal clock oscillating section comprises a section which shifts a phase of the internal clock signal in a direction indicated by an internal clock control signal supplied to said section;
    a second data temporal lead/lag detecting section which acquires the data signal and the internal clock signal, detects a time lag or a time lead of the phase of the data signal with respect to the internal clock signal, and generates a second temporal lead/lag detection signal representing a result of detection; and
    an internal clock control section which acquires the second temporal lead/lag detection signal, measures a cumulated amount of the time lag or the time lead based on the second temporal lead/lag detection signal, and when the cumulated amount reaches a second predetermined value larger than the first predetermined value, generates the internal clock control signal, which instructs that the phase of the internal clock signal should be shifted in a direction to cancel occurrence of the time lag or the time lead which has reached the cumulated amount, supplies the generated internal clock control signal to said internal clock oscillating section, and newly starts measuring.

2. The clock signal reproduction device according to claim 1,
    wherein said output clock control section comprises a section which acquires the first temporal lead/lag detection signal, measures a difference between a number of times the time lag is detected and a number of times the time lead is detected based on the first temporal lead/lag detection signal, stores data representing a result of measurement obtained after measurement is started, and when an absolute value of the difference reaches the first predetermined value, generates the output clock control signal, which instructs that the phase of the output clock signal should be shifted in a direction to cancel occurrence of the difference, supplies the generated output clock control signal to said output clock oscillating section, initializes a value of the data representing the result of measurement, and newly starts measuring.

3. The clock signal reproduction device according to claim 1,
    wherein said first data temporal lead/lag detecting section detects a timing at which a value of the data signal changes, and detects the time lag or the time lead of the phase of the data signal by determining when this timing occurs, before or after a timing at which a value of the output clock signal changes.

4. A clock signal reproduction method, comprising:
    an output clock oscillating step of generating an output clock signal, and changing a phase of the output clock signal in a direction indicated by an output clock control signal;
    an internal clock oscillating step of generating an internal clock signal;
    a first data temporal lead/lag detecting step of acquiring a data signal and the output clock signal, detecting a time lag or a time lead with respect to the output clock signal, of a timing at which a value of the data signal changes, and generating a first temporal lead/lag detection signal representing a result of detection;
    an output clock controlling step of acquiring the first temporal lead/lag detection signal, measuring a cumulated amount of the time lag or the time lead based on the first temporal lead/lag detection signal, and when the cumulated amount reaches a first predetermined value, generating the output clock control signal, which instructs that the phase of the output clock signal should be shifted in a direction to cancel occurrence of the time lag or the time lead which has reached the cumulated amount, supplying the generated output clock control signal to said output clock oscillating step, and newly starting measuring;

an inter-clock phase difference detecting step of acquiring the output clock signal and the internal clock signal, detecting a phase difference between the output clock signal and the internal clock signal, and generating an inter-clock phase difference signal representing the detected phase difference, wherein at said output clock controlling step, the inter-clock phase difference signal is further acquired, and generation of the output clock control signal is stopped while an amount of the phase difference represented by the inter-clock phase difference signal is being a predetermined amount, and wherein said internal clock oscillating step further comprises shifting a phase of the internal clock signal in a direction indicated by an internal clock control signal;

a second data temporal lead/lag detecting step of acquiring the data signal and the internal clock signal, detecting a time lag or a time lead of the phase of the data signal with respect to the internal clock signal, and generating a second temporal lead/lag detection signal representing a result of detection; and an internal clock control step of acquiring the second temporal lead/lag detection signal, measuring a cumulated amount of the time lag or the time lead based on the second temporal lead/lag detection signal, and when the cumulated amount reaches a second predetermined value larger than the first predetermined value, generating the internal clock control signal, which instructs that the phase of the internal clock signal should be shifted in a direction to cancel occurrence of the time lag or the time lead which has reached the cumulated amount, supplying the generated internal clock control signal to said internal clock oscillating section, and newly starts measuring.

5. A computer-readable recording medium in which a program is recoded, the program being for controlling a computer to function as:

an output clock oscillating section which generates an output clock signal and shifts a phase of the output clock signal in a direction indicated by an output clock control signal supplied thereto;

an internal clock oscillating section which generates an internal clock signal;

a first data temporal lead/lag detecting section which acquires a data signal and the output clock signal, detects a time lag or a time lead with respect to the output clock signal, of a timing at which a value of the data signal changes, and generates a first temporal lead/lag detection signal representing a result of detection;

an output clock control section which acquires the first temporal lead/lag detection signal, measures a cumulated amount of the time lead or the time lag based on the first temporal lead/lag detection signal, and when the cumulated amount reaches a first predetermined value, generates the output clock control signal, which instructs that the phase of the output clock signal should be shifted in a direction to cancel occurrence of the time lag or the time lead which has reached the cumulated amount, supplies the generated output clock control signal to said output clock oscillating section, and newly starts measuring;

an inter-clock phase difference detecting section which acquires the output clock signal and the internal clock signal, detects a phase difference between the output clock signal and the internal clock signal, and generates an inter-clock phase difference signal representing the detected phase difference, wherein said output clock control section further acquires the inter-clock phase difference signal, and stops generating the output clock control signal while an amount of the phase difference represented by the inter-clock phase difference signal is being a predetermined amount, and said internal clock oscillating section comprises a section which shifts a phase of the internal clock signal in a direction indicated by an internal clock control signal supplied to said section;

a second data temporal lead/lag detecting section which acquires the data signal and the internal clock signal, detects a time lag or a time lead of the phase of the data signal with respect to the internal clock signal, and generates a second temporal lead/lag detection signal representing a result of detection; and an internal clock control section which acquires the second temporal lead/lag detection signal, measures a cumulated amount of the time lag or the time lead based on the second temporal lead/lag detection signal, and when the cumulated amount reaches a second predetermined value larger than the first predetermined value, generates the internal clock control signal, which instructs that the phase of the internal clock signal should be shifted in a direction to cancel occurrence of the time lag or the time lead which has reached the cumulated amount, supplies the generated internal clock control signal to said internal clock oscillating section, and newly starts measuring.

* * * * *